United States Patent [19]

Wolf et al.

[11] Patent Number: 5,629,133

[45] Date of Patent: May 13, 1997

[54] LIQUID RADIATION-CURABLE FORMULATION, IN PARTICULAR FOR USE IN STEREOLITHOGRAPHY

[75] Inventors: Jean-Pierre Wolf, Courtaman; Adrian Schulthess, Tentlingen; Bettina Steinmann, Praroman; Max Hunziker, Düdingen, all of Switzerland

[73] Assignee: Ciba-Geigy Corporation, Tarrytown, N.Y.

[21] Appl. No.: 449,172

[22] Filed: May 24, 1995

Related U.S. Application Data

[62] Division of Ser. No. 292,654, Aug. 18, 1994, Pat. No. 5,461,088.

[30] Foreign Application Priority Data

Aug. 26, 1993 [CH] Switzerland ............... 2541/93

[51] Int. Cl.$^6$ ............... G03C 5/00; C08F 2/50; C08L 83/10
[52] U.S. Cl. ............... 430/269; 522/148; 522/182; 264/236; 264/347; 264/401
[58] Field of Search ............... 522/137, 142, 522/148, 172, 103, 182, 138, 141, 143; 430/269; 264/22, 236, 347

[56] References Cited

U.S. PATENT DOCUMENTS

| | | | |
|---|---|---|---|
| 3,471,588 | 10/1969 | Kanner et al. | 260/827 |
| 4,477,529 | 10/1984 | Campbell | 428/412 |
| 4,575,330 | 3/1986 | Hull | 425/174.4 |
| 4,582,885 | 4/1986 | Barber | 522/96 |
| 4,751,102 | 6/1988 | Adair et al. | 427/53.1 |
| 4,772,530 | 9/1988 | Gottschalk et al. | 430/138 |
| 4,772,541 | 9/1988 | Gottschalk et al. | 430/339 |
| 4,853,453 | 8/1989 | Schafer et al. | 528/28 |
| 4,902,724 | 2/1990 | Moore | 522/40 |
| 4,942,001 | 7/1990 | Murphy et al. | 264/22 |
| 5,026,741 | 6/1991 | Arai et al. | 522/33 |
| 5,032,662 | 7/1991 | Berger et al. | 528/25 |

FOREIGN PATENT DOCUMENTS

| | | |
|---|---|---|
| 0223587 | 11/1986 | European Pat. Off. . |
| 0378144 | 1/1990 | European Pat. Off. . |
| 0425441 | 10/1990 | European Pat. Off. . |

OTHER PUBLICATIONS

A. Noshey, J.E. McGrath "Block Copolymers" Academic Press 1977 pp. 400–402.

D.D. Phillips, T.B. Hill, J. Am. Chem. Soc. 1958, 80, pp. 3663–3667.

*Primary Examiner*—Susan W. Berman
*Attorney, Agent, or Firm*—David R. Crichton

[57] ABSTRACT

Liquid radiation-curable formulation, in particular for stereolithography, based on at least one compound that contains radically polymerizable groups, and at least one photoinitiator suitable for the polymerization, which formulation additionally contains a polyoxyalkylene-polysiloxane block copolymer that is selected from copolymers of the chemical formulae (I): $R^1\!-\!(OC_cH_{2c})_d\!-\![T]\!-\!(C_cH_{2c}O)_{d-1}\!-\!(C_cH_{2c})_f\!-\!OR^1$, (II):

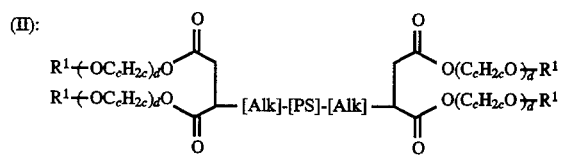

and (III):

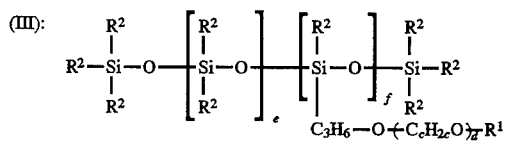

wherein:

$R^1$ is a hydrogen atom or a $C_1$–$C_8$ alkyl group;

$R^2$ is a methyl or phenyl group;

[T] is a polysiloxane group [PS] terminated as described in the specification in more detail;

[PS] is the group of formula

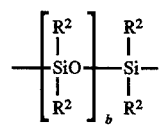

and

[Alk] is an alkylene group of 3 to 10 carbon atoms, as well as novel block copolymers of formulae (I) and (II). The cured formulations have, inter alia, superior impact strength.

8 Claims, No Drawings

LIQUID RADIATION-CURABLE FORMULATION, IN PARTICULAR FOR USE IN STEREOLITHOGRAPHY

This is a Divisional of Ser. No. 08/292,654, filed Aug. 18, 1994 now U.S. Pat. No. 5,461,088.

The present invention relates to a liquid radiation-curable formulation, in particular for use in stereolithography, based on at least one compound that contains radically polymerisable groups, and at least one photoinitiator suitable for the polymerisation of the said compound, to specific novel polyoxyalkylene-polysiloxane block copolymers which, together with other already known block copolymers of this type, are suitable as very useful formulation components for such formulations, and to methods of processing said formulations.

In the stereolithographic technique as disclosed, inter alia, in U.S. Pat. No. 4,575,330, three-dimensional objects are fabricated from a plurality of layers from liquid radiation-curable formulations by prehardening a thin layer of the formulation with actinic radiation in defined manner such that the layer has the desired cross-sectional shape of the object at this juncture and is simultaneously polymerised on to the layer cured in the preceding step. The object so obtained may additionally be postcured, for example thermally.

Liquid formulations comprising radiation-curable components and also photoinitiators are in principle suitable for stereolithography. If it is desired to obtain objects that can actually be used in practice, then formulations that are complicated to match up and formulate will normally have to be used. Systems based on compounds containing radically polymerisable groups, preferably based on the polyacrylates and/or polymethacrylates disclosed e.g. in EP-A-0 378 144, have in particular found acceptance. The formulations disclosed therein, which contain di- and polyfunctional acrylates and/or methacrylates as well as certain monomers containing a single carbon double bond and suitable photoinitiators for the cited components, give objects that have a high glass transition temperature and also have mechanical and processing properties that are suitable for may fields of use. The material, however, is quite brittle, so that an often desirable mechanical aftertreatment of the object obtained by stereolithography is difficult to effect.

Less brittle material can be obtained with stereolithographic resin formulations to which specific polyurethane acrylates and/or methacrylates are added. Such mixtures are disclosed e.g. in EP-A-0 425 441, but their use has the drawback that the glass transition temperature of the cured material falls and also the viscosity of the stereolithographic formulations can rise very steeply.

It has now been found that material of improved impact strength can be obtained without the Tg value and the heat distortion of the material being significantly lowered by using for the preparation of said material formulations based on compounds containing radically polymerisable groups and on photoinitiators, to which formulations are added polyoxyalkylene-polysiloxane block copolymers of formula (I), (II) or (III) below. The viscosity of the liquid starting formulations is also not adversely affected by this modification, as is the case when, instead of the polyoxyalkylene-polysiloxane block copolymers of this invention, other copolymers are used that lead to a steep rise in the viscosity.

Accordingly, the invention relates to a liquid radiation-curable formulation, in particular for stereolithography, comprising at least one compound that contains radically polymerisable groups, and at least one photoinitiator suitable for the polymerisation, which formulation additionally comprises a polyoxyalkylene-polysiloxane block copolymer which is selected from copolymers of the chemical formulae (I): 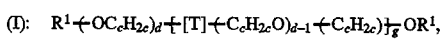

(II):

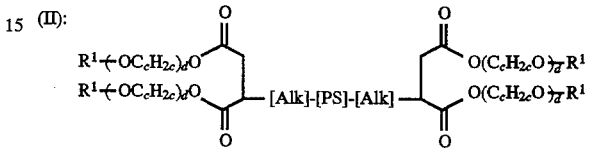

and (III):

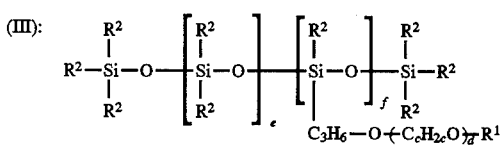

in which formulae the individual symbols have the following meanings:

$R^1$ is a member selected from hydrogen and $C_1$–$C_8$ alkyl;

c is a number from 1 to 8 corresponding to the average number of carbon atoms of an akylene unit in a polyoxyalkylene group $(C_cH_{2c}O)_d$;

d is an integer from 1 to 100;

g is an integer from 1 to 4;

[T] is a group selected from the groups of formulae T1 to T12:

T1: —O⁺PS⁺O—,

T2: 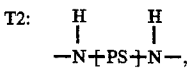

T3: —O-[Alk]-[PS]-[Alk]-O—,

T4: 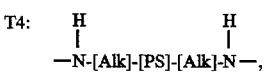

T5: 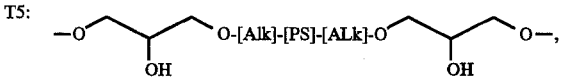

T6: 

T7: 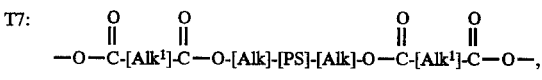

T8: 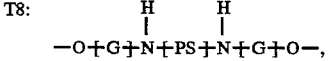

T9: —O⁺G⁺O⁺PS⁺O⁺G⁺O—,

T10: 

T11: —O—[G]—O-[Alk]-[PS]-[Alk]-O—[G]—O—,

T12: 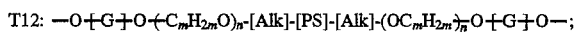

[PS] is a polysiloxane of formula

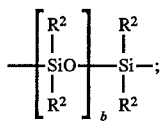

$R^2$ is a group selected from methyl and phenyl;

b is an integer from 1 to 100;

[Alk] is an alkylene group of 3 to 10 carbon atoms;

[Alk$^1$] is an alkylene group of 1 to 20 carbon atoms;

m is a number from 1 to 8 corresponding to the average number of carbon atoms of an alkylene unit in a polyoxyalkylene group $(C_mH_{2m}O)_n$;

n is an integer from 1 to 50;

[G] is a group of formula

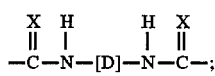

X is an atom selected from oxygen and sulfur;

[D] is a divalent organic radical containing at least 2 carbon atoms;

e is an integer from 1 to 100, and f is an integer from 1 to 50.

The symbols c and m indicate the averge number of carbon atoms that can be calculated for an alkylene unit in the corresponding polyoxyalkylene group. The symbols therefore do not absolutely have to be whole numbers, as the polyoxyalkylene block may also consist of copolymers from monomers containing different numbers of carbon atoms and which, in addition, may be used in different ratios. Illustrative examples of customary monomers are ethylene oxide, propylene oxide or tetrahydrofuran.

[D] is preferably chosen from alkylene groups of 2 to 8 carbon atoms and divalent radicals containing not more than 30, preferably not more than 20, carbon atoms, which last mentioned radicals contain at least one six-membered carbon ring which is unsubstituted or which carries one or more than one straight-chain or branched $C_1$-$C_4$alkyl substituent.

[Alk] is preferably a —(CH$_2$)$_3$— group.

Some of the above-mentioned block copolymers of formulae (I) and (II) are novel, especially those in which the symbols have the following meanings:

$R^1$ is a member selected from hydrogen and $C_1$-$C_8$alkyl;

c is a number from 1 to 4 corresponding to the average number of carbon atoms of an alkylene unit in a polyoxyalkylene group $(C_cH_{2c}O)_d$;

d is an integer from 7 to 25;

g is 1;

[T] is a group of formula

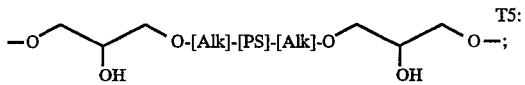

[PS] is a polysiloxane group of formula

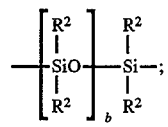

$R^2$ is methyl;

b is an integer from 5 to 50;

[Alk] is an alkylene group of 3 to 10 carbon atoms.

These novel polyoxyalkylene-polysiloxane block copolymers are likewise an object of the invention. [Alk] is also in this context preferably a —(CH$_2$)$_3$— group.

Copolymers of formula (I), wherein [T] has the meaning of T1 or T2, may conveniently be obtained by reacting the desired hydrogen-terminated polysiloxane with the desired polyoxyalkylenediol or -diamine in accordance with the following reaction scheme:

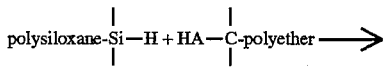

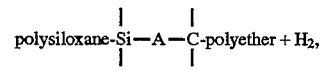

in which A is either an oxygen atom or a NH group. Also suitable is the reaction of α,ω-dichloropolysiloxanes with the corresponding terminated polyethers according to U.S. Pat. No. 5,032,662. An overview of processes for the preparation of block copolymers of this type will be found, inter alia, in Allen Noshay, James E. McGrath, "Block Copolymers"; Academic Press New York 1977, p. 401 et seq. Copolymers of formula (I) which contain O—[Alk]—[PS]—[Alk]—O groups can be prepared from e.g. polysiloxanes of the type R$^{16}$O—[Alk]—[PS]—[Alk]—OR$^{16}$, wherein R$^{16}$ is

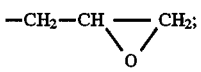

—CH$_2$—CH(OH)—CH$_2$OH (in the case of copolymers in which [T]=T5) or hydrogen (in the case of copolymers in which [T]=T3), which are obtainable in accordance with or by a method analogous to that described in U.S. Pat. No. 4,853,453 by reacting said polysiloxanes in conventional manner with polyoxyalkylenediols to the desired polysiloxane-polyoxyalkylene block copoymers. Copolymers of formula (I), in which [T]=T4, can be prepared in analogous manner from polysiloxanes of the type H$_2$N—[Alk]—[PS]—[Alk]—NH$_2$. The preparation of copolymers of formula (I), in which [T] has the meaning of T5 and [Alk] is —(CH$_2$)$_3$—, can also be effected in particularly simple manner from the reaction product of a hydrogen-terminated polysiloxane of formula H—[PS]—H with allyl glycidyl ether, a chemical produced on a commercial scale (Alcolac, Inc., Rhône-Poulenc, CPS Chemical Co., Inc). Relevant particulars will be found in e.g. the Comprehensive Handbook of Hydrosilylation, Pergamon Press, Oxford 1991. To prepare block copolymers of formula (I), wherein the group [T] has the meaning of T7, polysiloxanes of formula HO—[Alk]—[PS]—[Alk]—OH must first be extended with dicarboxylic acids of the type HOOC—[Alk¹]—COOH. To prepare copolymers in which the group [T] has one of the meanings of T8 to T12, reaction with the desired diisocyanate of formula OCN—[D]—NCO or with the corresponding dithioisocyanate is additionally necessary. This can be done by reacting the diisocyanate or diisothiocyanate simultaneously with the polysiloxane and the polyoxyalkylene-diol or the corresponding diamine, or in a separate step, the reaction of the polysiloxane or polyether diols with the diisocyanate or dithioisocyanate can be carried out first, followed by the reaction with the remaining component of the block copolymer. To obtain the copolymer in which [T]=T12, the polysiloxane used is a reaction product of HO—[Alk]—[PS]—[Alk]—OH with a polyoxyalkylene-diol of formula HO—$(C_mH_{2m}O)_n$—H or a reaction product of HO—[Alk]—[PS]—[Alk]—OH with suitable monomers such as ethylene oxide, propylene oxide or tetrahydrofuran or with mixtures of two or more of such components.

The preparation of block copolymers of formula (II) can be carried out starting from the desired polyoxyalkylene-diols and polysiloxanes of formula

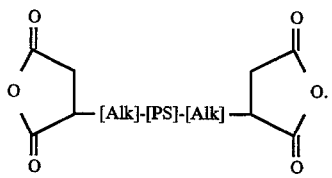

The last mentioned polysiloxanes may be obtained by reacting hydrogen-terminated polysiloxanes with succinic acid derivatives of formula

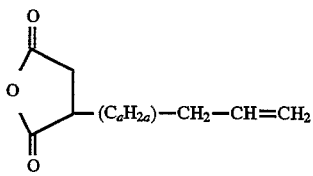

wherein a is an integer from 0 to 7, and are also commercially obtainable. To prepare the particularly preferred copolymers of formula (II), wherein [Alk] is —$(CH_2)_3$—, the requisite allylsuccinic acid may be prepared from propene and maleic anhydride in very elegant manner according to D. D. Phillips, T. B. Hill, J. Am. Chem. Soc. 1958, 80, p. 3663.

Eligible block copolymers of formula (III) find utility as constituents of cosmetics. They are commercially obtainable, e.g. under the registered trademark DOW CORNING®190 and 193 or Silwet®L7500, L-7600, L-7607 or L77 (UNION CARBIDE).

The novel formulations will usually contain the novel polysiloxane-polyoxyalkylene block copolymers in an amount of 5 to 50% by weight, preferably in amount of 10 to 35% by weight.

Preferred formulations are those previously described that comprise polysiloxane-polyoxyalkylene block copolymers of formula (I), (II) or (III), wherein $R^1$ is a member selected from hydrogen and $C_1$-$C_4$alkyl, $R^2$ is a methyl group;

[Alk] is a —$(CH_2)_3$— group;

[Alk¹] is an alkylene group containing 2 to 10, preferably 2 to 4 carbon atoms;

X is an oxygen atom;

[D] is a divalent organic radical selected from radicals of the following formulae:

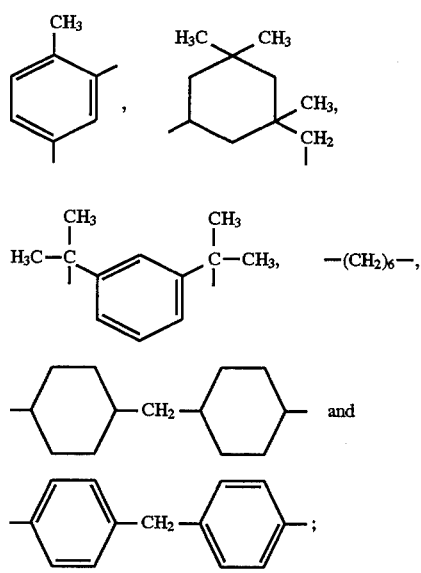

c is a number from 2 to 4;

d is an integer from 5 to 50;

b is an integer from 10 to 50;

m is a number from 2 to 4;

n is an integer from 5 to 20;

e is an integer from 1 to 50, and f is an integer from 1 to 25.

Very particularly preferred novel formulations are those comprising block copolymers of formula (I), (II) or (III), wherein $R^1$ is a methyl group;

[Alk] and

[Alk¹] are each a —$(CH_2)_3$— group;

c is 2;

d in the case of a block copolymer of formula (I) or (II), is an integer from 7 to 25 and, in the case of a block copolymer of formula (III), is an integer from 2 to 20;

g is 1;

m is 2, and n is an integer from 7 to 20.

As compounds that contain the radically polymerisable groups, the novel formulations preferably comprise mixtures with the following components:

(i) difunctional monomeric or polymeric acrylates or methacrylates;

(ii) tri- or polyfunctional acrylates or methacrylates;

(iii) unsaturated monomers of formula

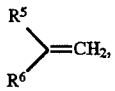  (IV):

wherein $R^5$ is a member selected from hydrogen and methyl, and $R^6$ is a radical of formula $$-\overset{O}{\underset{\|}{C}}-O-R^7 \qquad (V):$$

wherein $R^7$ is a radical selected from the group consisting of tetrahydrofurfuryl, cyclohexyl, 2-phenoxyethyl, benzyl, isobornyl, glycidyl, dicyclopentyl, morpholinoethyl, dimethylaminoethyl and straight-chain and branched $C_1$-$C_{20}$alkyl radicals, and if $R^5$ is a hydrogen atom, $R^6$, in additional to the radicals cited above, can also be a radical selected from the group consisting of pyrrolidon-2-yl, imidazonyl, carbazolyl, anthracenyl, phenyl, $C_5$-$C_8$cycloalkyl, naphthenyl, 2-norbornyl, pyridyl, N-caprolactamyl, formamidyl, acetamidyl and toluolyl.

Mixtures that are very suitable for use in stereolithography are those that each contain at least one representative of the aforementioned components (i), (ii) and (iii).

Suitable components (i) typically include the diacrylate and dimethacrylate esters of aliphatic or cycloaliphatic diols, for example 1,3-butylene glycol, 1,4-butanediol, neopentyl glycol, 1,6-hexanediol, diethylene glycol, triethylene glycol, tetraethylene glycol, polyethylene glycol 400, polyethylene glycol 600, tripropylene glycol, ethoxylated or propoxylated neopentyl glycol, 1,4-dihydroxymethylcyclohexane, 2,2-bis-(4-hydroxycyclohexyl)propane or bis(4-hydroxycyclohexyl)methane, which may be alkoxylated, preferably ethoxylated or propoxylated, or also glycidylated. Some of these monomeric or oligomeric di(meth)acrylates are commercially available, for example from the SARTOMER Company under the product name SR-348 for the dimethacrylate of ethoxylated bisphenol A, and under the product name SR-349 for diacrylate of ethoxylated bisphenol A. The compounds preferably have a molecular weight in the range from 200 to 1000.

Compounds which may be suitably used as component (ii) of the above mixture are: 1,1,1-trimethylolpropane triacrylate or methacrylate, ethoxylated 1,1,1-trimethylolpropane triacrylate or methacrylate, pentaerythritol tetraacrylate, pentaerythritol monohydroxy-triacrylate or -methacrylate, dipentaerythritol monohydroxypentaacrylate or -methacrylate. Such compounds are known and some are commercially available, for example from the SARTOMER Company under the product names SR-295, SR-350, SR-351, SR-367, SR-399, SR-444 and SR-454. The compounds of this type preferably have a molecular weight in the range from c. 200 to 500.

The mixtures usually comprise about 20 to 80, preferably 30 to 80% by weight, of component (i), 5 to 25% by weight of component (ii) and 1 to 25% by weight of component (iii).

Particularly preferred novel formulations are those comprising as component (i) at least one compound of formula $$\left[ [Z] - \bigotimes - O - \underset{R^{14}}{\overset{R^8}{\underset{|}{CH}}} - \overset{O}{\underset{|}{CH}} - (CH_2)_p - \overset{R^9}{\underset{\underset{O}{\|}}{\overset{|}{C}}} - \overset{\diagdown}{C} = CH_2 \right]_2 \qquad (VI):$$

wherein p is 0 or 1, t is 0 or 1 or, if p is 0, is an integer from 1 to 3,

[Z] is —O—, —S—, —SO$_2$— or C($R^{10}$)($R^{11}$)—, $R^{10}$ and $R^{11}$ are each independently of the other a radical selected from hydrogen, —CF$_3$ and methyl, $R^{14}$ if p is 0, is hydrogen or methyl, and, if p is 1, is hydrogen, $R^8$ is p is 0, is hydrogen and if p is 1, is hydroxyl and $R^9$ is hydrogen or methyl, especially if they comprise as component (ii) a triacrylate or trimethacrylate of formula $$R^{12}-CH_2-C(CH_2-R^{13})_3 \qquad (VII)$$

wherein $R^{12}$ is methyl or a radical of formula $$-O-CH_2-C(CH_2OH)[CH_2-O-\overset{O}{\underset{\|}{C}}-C(R^{15})=CH_2]_2, \qquad (VIII):$$

each $R^{15}$ is independently of the other hydrogen or methyl, and $R^{13}$ is a radical of formula $$-O-\overset{O}{\underset{\|}{C}}-C(R^{15})=CH_2. \qquad (IX):$$

Finally, particularly good results are obtained with formulations in which component (i) is at least two different compounds of formula (VI) in which

[Z] in both compounds is a —C(CH$_3$)$_2$— group, and p in the formula of one of the two compounds is 0 and in the other is 1, and component (iii) is either 1-vinylpyrrolidone, phenoxyethylacrylate, phenoxyethylmethacrylate or a mixture of at least two of the cited components.

These formulations are especially preferred whenever more than 50% by weight of component (i) consists of compounds of formula (VI), wherein p=1.

Any type of photoinitiator which, when suitably irradiated, forms free radicals can be used in the novel formulations. Typical known photoinitiators are benzoins, such as benzoin, benzoin ethers, including benzoin methyl ether, benzoin ethyl ether and benzoin isopropyl ether, benzoin phenyl ether and benzoin acetate; acetophenones, including acetophenone, 2,2-dimethoxyacetophenone and 1,1-dichloroacetophenone; benzil, benzil ketals such as benzil dimethyl ketal and benzil diethyl ketal; anthraquinones, including 2-methylanthraquinone, 2-ethylanthraquinone, 2-tert-butylanthraquinone, 1-chloroanthraquinone and 2-amylanthraquinone; triphenylphosphine; benzoylphosphine oxides, for example 2,4,6-trimethylbenzoyl diphenylphosphine oxide (Luzirin®TPO); benzophenones such as benzophenone and 4,4'-bis(N,N'-dimethylamino) benzophenone; thioxanthones and xanthones; acridine derivatives; phenazine derivatives; quinoxaline derivatives or 1-phenyl-1,2-propanedione; 2-O-benzoyl oxime; 1-aminophenyl ketones or 1-hydroxyphenyl ketones such as 1-hydroxycyclohexyl phenyl ketone, phenyl 1-hydroxyisopropyl ketone and 4-isopropylphenyl-1-(hydroxyisopropyl) ketone, all of which are known compounds.

Particularly suitable photoinitiators which are normally used in conjunction with a He/Cd laser as light source are acetophenones, including 2,2-dialkoxybenzophenones and 1-hydroxyphenylketones, typically 1-hydroxycyclohexyl phenyl ketone or 2-hydroxyisopropyl phenyl ketone (=2-hydroxy-2,2-dimethylacetophenone).

Another classs of photoinitiators normally used when irradiating with argon ion lasers are the benzil ketals, typically benzil dimethyl ketal. It is particularly preferred to use as photoinitiator an α-hydroxyphenyl ketone, benzil dimethyl ketal or 2,4,6-trimethylbenzoyl diphenylphosphine oxide.

Another class of suitable photoinitiators comprises the ionic dye-counter ion compounds which are capable of absorbing actinic radiation and generating free radicals which initiate the polymerisation of the acrylates. The formulations of the invention containing ionic dye-counter ion compounds can be cured more variably in this way with visible light within the adjustable wavelength range of 400–700 nm. Ionic dye-counter ion compounds and their mode of action are disclosed inter alia, in EP-A-0 223 587 and U.S. Pat. Nos. 4,751,102; 4,772,530 and 4,772,541. Typical examples of suitable ionic dye-counter ion compounds are the anionic dye-iodonium ion complexes, the anionic dye-pyrylium ion complexes and, especially, the cationic dye-borate anion compounds of formula

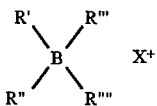

wherein $X^+$ is a cationic dye and R', R", R''' and R'''' are each independently of one another an alkyl, aryl, alkaryl, allyl, aralkyl, alkenyl or alkynyl group, or an alicyclic or saturated or unsaturated heterocyclic group.

It is common practice to add the photoinitiators in effective amounts, i.e. in amounts of c. 0.1 to 10% by weight, based on the total amount of the formulation. If the novel formulations are used for stereolithographic techniques in which laser beams are normally used, it is essential to adjust the absorption capacity of the mixtures by the type and concentration of the photoinitiator such that the depth of cure at normal laser speed is about 0.1 to 2.5 mm.

The novel formulations may also contain other photoinitiators of different sensitivity to radiation of emission lines of different wavelengths. The inclusion of such photoinitiators effects the better utilisation of a UV/VIS light source which radiates emission lines of different wavelength. It is advantageous to choose these other photoinitiators and to use them in a concentration such that an identical optical absorption is produced with respect to the emission lines used.

If desired, customary additives can be added to the formulations of this invention, typically stabilisers such as UV stabilisers, polymerisation inhibitors, slip agents, wetting agents, flow control agents, sensitisers, antiprecipitants, surfactants, dyes, pigments or fillers.

The novel formulations should preferably have a viscosity in the range from 200 to 5000 mPa.s, most preferably from 500 to 3500 mPa.s, at a temperature from 20° to 30° C.

The novel formulations can be prepared in known manner, conveniently by premixing individual components and subsequently blending these premixes, or by blending all components in conventional apparatus, such as stirred vessels, excluding light and at room or slightly elevated temperature.

The novel photosensitive formulations can be polymerised by irradiation with actinic light, typically with electron beams, X-rays, UV or VIS light, i.e. with radiation in the wavelength range from 280–650 nm. Particularly suitable light sources are HeCd, argon or nitrogen laser light as well as metal vapour and NdYAG lasers with multiple frequency.

Those skilled in the art will know that the appropriate photoinitiator for each selected light source must be chosen and, if necessary, sensitised. It has been found that the depth of penetration of the radiation into the polymerised formulation and the processing rate are directly related to the absorption coefficient and the concentration of the photoinitiator. In stereolithography it is preferred to use those photoinitiators that produce the greatest number of free radicals and which are able to effect the greatest penetration of radiation into the formulations to be polymerised.

The invention also relates to a process for the production of a cured product, which comprises treating formulations as described above with actinic radiation.

The invention accordingly also relates to a process for the production of three-dimensional objects from the novel liquid formulations by stereolithographic techniques, which comprises irradiating a layer of novel liquid formulation over the entire surface or in a predetermined pattern with actinic light from a UV/VIS light source, such that within the irradiated areas a layer solidifes in a desired layer thickness, then a new layer of novel formulation is formed on the solidified layer, which layer is likewise irradiated over the entire surface or in a predetermined pattern, and such that three-dimensional objects are formed from a plurality of solidified layers which adhere to one another by repeated coating and irradiation.

In this process the preferred light source is a laser beam which, in a particularly preferred embodiment of the invention, is computer-controlled.

If the novel formulations are used as coating formulations, clear and hard coats are obtained on wood, paper, metal, ceramic or other surfaces. The coating thickness may vary over a very wide range and be from c. 1 µm to c. 1 mm. Relief images for printed circuit boards or printing plates can be produced from the novel formulations, conveniently by computer-controlled laser light of appropriate wavelength or using a photomask and a suitable light source.

It is preferred to use the novel formulations for the production of photopolymerised layers, especially in the form of three-dimensional objects which are formed from a plurality of solidified layers which adhere to one another.

EXAMPLE 1

Preparation of a polyoxyalkylene-polydimethylsiloxane block copolymer of polyethylene glycol monomethyl ether and a polysiloxane of formula

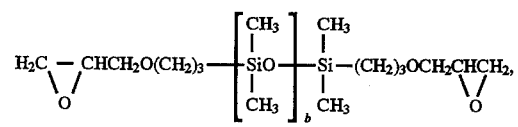

wherein b is 10 and the polysiloxane has an epoxy value of 0.18 equivalent/100 g.

A solution of 1.8 g of $BF_3.Et_2O$ in 20 ml of dioxane is added dropwise at 100° C. to a solution of 0.1 mol (110 g) of the polysiloxane (supplier: Wacker-Chemie GmbH, Munich) and 0.2 mol (110 g) of polyethylene glycol monomethyl ether (Mw=550). When the addition is complete, stirring is continued at 130° C. until no more epoxy groups are detectable (16 h). The clear, yellowish solution is dried under a high vacuum ($1.3 \cdot 10^{-4}$ bar; 60° C.; 2 h).

Yield: 200 g of a yellowish oil that crystallises upon standing.

EXAMPLE 2

Preparation of a polyoxyalkylene-polydimethylsiloxane block copolymer of polyethylene glycol monomethyl ether and a polysiloxane of formula

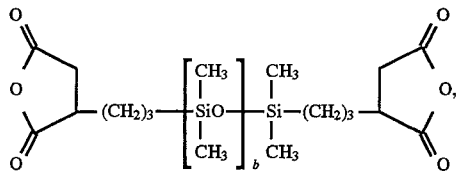

wherein b=25 and the polysiloxane has an anhydride value of 1.0 milliequivalent/g.

A solution of 0.06 mol (120 g) of the polysiloxane (supplier: Wacker-Chemie GmbH, Munich), 0.24 mol (132 g) of polyethylene glycol monomethyl ether (Mw=550) and 1.2 g of p-toluenesulfonic acid in 500 ml of xylene is heated on a water separator under reflux until the expected theoretical amount of water is separated (c. 30 h). The xylene is stripped off on a rotary evaporator and the resultant yellowish oil is dried under a high vacuum ($1.3 \cdot 10^{-4}$ bar; 60° C.; 2 h).

Yield: 225 g of a yellowish oil that partly crystallises upon standing.

EXAMPLE 3

Preparation of a block copolymer of toluylene-2,4-diisocyanate, polyethylene glycol monomethyl ether and a polysiloxane of formula

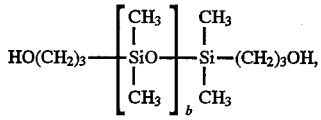

wherein b=10 and the polysiloxane has a hydroxyl number of 110 mg KOH/g 0.075 mol (76.5 g) of polysiloxane (IM®11, Wacker-Chemie GmbH, Munich) is added dropwise at 60° C. and under nitrogen over 1.5 h to a mixture of 0.15 mol (22 ml) of toluylene-2,4-diisocyanate and 3 drops of benzoyl chloride. The reaction solution is stirred for a further 4 h at 60° C. and the content of isocyanate groups is determined by titration to be 1.53 mol/kg (theory: 1.46 mol/kg). Afterwards the reaction solution is cooled to 45° C. and 0.13 g of tin 2-ethylhexanoate is added. Under atmospheric air, 0.16 mol (118.9 g) of polyethylene glycol monomethyl ether (Mw=750) is slowly added dropwise and the mixture is stirred at 45° C. until no more isocyanate groups can be detected (32 h).

Yield: 221 g of an orange oil that slowly crystallises upon standing. GPC: $M_n=2450$, $M_w/M_n=2.33$; in THF with polystyrene as standard).

EXAMPLE 4

Preparation of a block copolymer of toluylene-2,4-diisocyanate, polyethylene glycol monomethyl ether and a polysiloxane of

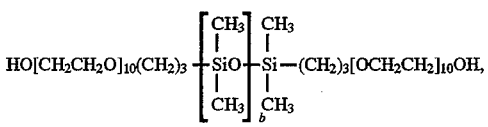

wherein b=15 and the polysiloxane has a hydroxyl number of 62 mg KOH/g (IM®22, supplier: Wacker-Chemie GmbH, Munich).

The general procedure of Example 3 is carried out, but using 0.025 mol (40.06 g) of polysiloxane, 0.05 mol (7.4 ml) of toluylene-2,4-diisocyanate and 0.05 mol (97.64 g) of polyethylene glycol monomethyl ether (Mw=2000), to give 146 g of product in form of a yellowish-orange crystalline substance.

EXAMPLE 5

90 g of a liquid radiation-sensitive mixture having the formulation:

| | |
|---|---|
| 48.85 parts by weight | of diglycidyl diacrylate of bisphenol A |
| 25 parts by weight | of ethoxylated dimethacrylate of bisphenol A (SR 348*) |
| 12 parts by weight | of trimethylolpropane trimethacrylate |
| 5 parts by weight | of 2-phenoxyethylmethacrylate |
| 5 parts by weight | of 1-vinyl-2-pyrrolidone |
| 4 parts by weight | 1-hydroxycyclohexylphenylmethanone (Irgacure ® 184) |
| 0.15 part by weight | of 4-methoxyphenol |

*ex Sartomer Comp.

are mixed with 10 g of a commercial polyoxyalkylene-polysiloxane block copolymer (IM®22; commercial product sold by Wacker-Chemie GmbH, Munich) and to the mixture is again added sufficient 1-hydroxycyclohexylphenylmethanone (Irgacure®184) that concentration of this photoinitiator in the total mixture is 4% by weight. The formulation containing the block copolymer has a viscosity of 1500 mPa.s at 30° C.

Objects are produced by irradiating the formulation with a He/Cd laser at a radiation intensity of 40 mJ/cm².

The mechanical properties of the object cured by laser radiation (green strength) and of the object obtained after postcuring are measured using a Lloyd®500 tensile strength tester (supplied by Lloyd). The objects are typically 50 mm long and have a cross-section of 1.2×0.3 mm.

The objects obtained by laser curing (green models) have the following properties: flexural modulus (DIN 53 371)=15 N/mm².

To effect the full cure, the green models are irradiated for 30 min in a postcuring apparatus (PCA, supplied by 3D Systems, Inc.) at maximum radiation intensity. The objects so obtained have the following properties:

| | |
|---|---|
| flexural modulus | = 2418 N/mm². |
| elongation at break (DIN 53 455) | = 3%. |

To determine the impact strength, the formulation is cast between two glass plates spaced 4 mm apart and cured for 30 min in the postcure oven (PCA, supplied by 3D Systems, Inc.) at maximum radiation intensity. The objects measuring 50×10×4 mm are produced.

| Impact strength (DIN 52 453) | = 8.0 kJ/m². |
|---|---|

The glass transition temperature (TMA; 10° C./min; 0.5N; using a Mettler TA 4000) of the material is 92° C.

Using the above radiation-sensitive formulation without addition of the polyoxyalkylene-polysiloxane block copolymer under the same conditions, the following values are obtained:

| viscosity at 30° C. | = 2140 mPa · s |
|---|---|
| flexural modulus (40 mJ/cm²) of the green models | = 66.1 N/mm². |
| flexural modulus of the cured objects | = 2687.4 N/mm². |
| elongation at break | = 2.1%. |
| impact strength | = 2.0 kJ/m². |
| glass transition temperature | = 95° C. |

EXAMPLE 6

90 g of a liquid radiation-sensitive mixture of Example 5 are mixed with 10 g of the polyoxyalkylene-polysiloxane block copolymer of Example 1 and to the mixture is again added sufficient 1-hydroxycyclohexylphenylmethanone (Irgacure®184) that the concentration of this photoinitiator in the total mixture is 4% by weight (formulation 6A). A formulation comprising 70 g of the above radiation-sensitive mixture and 30 g of the block copolymer of Example 1 is prepared in similar manner (formulation 6B).

| Property | Formulation | |
|---|---|---|
| | 6A | 6B |
| viscosity at 30° C. in mPa · s | 1750 | 1340 |
| flexural modulus of the green models (40 mJ/cm²) in N/mm² | 61.0 | 15.0 |
| flexural modulus of the cured objects in N/mm² | 2598.0 | 1686.0 |
| elongation at break in % | 3.3 | 6.1 |
| impact strength in kJ/m² | 9.0 | 11.0 |

EXAMPLE 7

90 g of a liquid radiation-sensitive mixture of Example 5 are mixed with 10 g of the polyoxyalkylene-polysiloxane block copolymer of Example 3 and to the mixture is again added sufficient 1-hydroxycyclohexylphenylmethanone (Irgacure®184) that the concentration of this photoinitiator in the total mixture is 4% by weight (formulation 7A). A formulation comprising 70 g of the above radiation-sensitive mixture and 30 g of the block copolymer of Example 3 is prepared in similar manner (formulation 7B).

| Property | Formulation | |
|---|---|---|
| | 7A | 7B |
| viscosity at 30° C. in mPa · s | 2620 | 3270 |
| flexural modulus of the green models (40 mJ/cm²) in N/mm² | 48.0 | 23.0 |
| flexural modulus of the cured objects in N/mm² | 2632.0 | 1525.0 |
| elongation at break in % | 3.0 | 7.0 |
| impact strength in kJ/m² | 9.0 | 11.0 |

EXAMPLE 8

90 g of a liquid radiation-sensitive mixture of Example 5 are mixed with 10 g of the polyoxyalkylene-polysiloxane block copolymer of Example 4 and to the mixture is again added sufficient 1-hydroxycyclohexylphenylmethanone (Irgacure®184) that the concentration of this photoinitiator in the total mixture is again 4% by weight (formulation 8A). A formulation comprising 70 g of the above radiation-sensitive mixture and 30 g of the block copolymer of Example 4 is prepared in similar manner (formulation 8B).

| Property | Formulation | |
|---|---|---|
| | 8A | 8B |
| viscosity at 30° C. in mPa · s | 2470 | 3240 |
| flexural modulus of the green models (40 mJ/cm²) in N/mm² | 33.0 | 12.0 |
| flexural modulus of the cured objects in N/mm² | 2679.0 | 1664.0 |
| elongation at break in % | 3.0 | 5.0 |
| impact strength in kJ/m² | 7.0 | 12.0 |

What is claimed is:

1. A process for the preparation of a cured product, which comprises treating a liquid radiation-curable formulation comprising at least one compound that contains free radically polymerisable groups, and at least one photoinitiator suitable for the polymerisation, which formulation additionally comprises a polyoxyalkylene-polysiloxane block copolymer which is selected from copolymers of the chemical formulae (I): 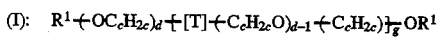

(II): 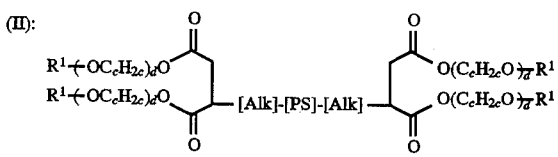

and (III) 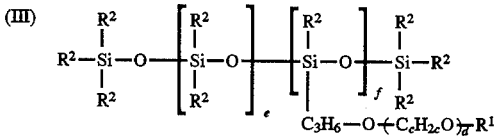

in which formulae the individual symbols have the following meanings:

$R^1$ is a member selected from hydrogen and $C_1$-$C_8$alkyl;

c is a number from 1 to 8 corresponding to the average number of carbon atoms of an akylene unit in a polyoxyalkylene group $(C_cH_{2c}O)_d$;

d is an integer from 1 to 100;

g is an integer from 1 to 4;

[T] is a group selected from the groups of formulae T1 to T12:

T1: 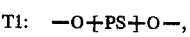

T2: 

-continued

T3: —O-[Alk]-[PS]-[Alk]-O—

T4:
—N-[Alk]-[PS]-[Alk]-N—

T5: 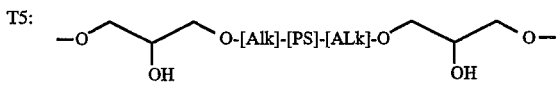

T6: 

T7: 

T8: 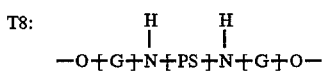
—O+G+N+PS+N+G+O—

T9: —O+G+O+PS+O+G+O—

T10: 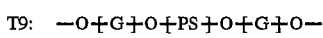
—O+G+N-[Alk]-[PS]-[Alk]-N+G]·O—

T11: —O+G+O-[Alk]-[PS]-[Alk]-O+G]·O—

T12: —O+G+O+(C$_m$H$_{2m}$O)$_n$-[Alk]-[PS]-[Alk]-(OC$_m$H$_{2m}$)$_n$O+G+O—

[PS] is a polysiloxane of formula

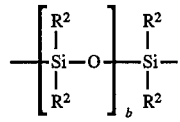

R$^2$ is a group selected from methyl and phenyl;
b is an integer from 1 to 100;
[Alk] is an alkylene group of 3 to 10 carbon atoms;
[Alk$^1$] is an alkylene group of 1 to 20 carbon atoms;
m is a number from 1 to 8 corresponding to the average number of carbon atoms of an alkylene unit in a polyoxyalkylene group (C$_m$H$_{2m}$O)$_n$;
n is an integer from 1 to 50;
[G] is a group of formula

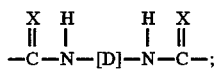

X is an atom selected from oxygen and sulfur;
[D] is a divalent hydrocarbon radical containing at least 2 carbon atoms;
e is an integer from 1 to 100, and
f is an integer from 1 to 50
with actinic radiation
with the proviso that when the formulation comprises a polyoxyalkylene-polysiloxane block copolymer of formula (III) then the compounds that contain free radically polymerisable groups are a mixture comprising the following components:

(i) a difunctional monomeric or polymeric acrylate or methacrylate;
(ii) an acrylate or methacrylate having a (meth)acrylate functionality greater than 2;
(iii) an unsaturated monomer of formula

wherein

R$^5$ is a member selected from hydrogen and methyl, and

R$^6$ is a radical of formula

wherein

R$^7$ is a radical from the group consisting of tetrahydrofurfuryl, cyclohexyl, 2-phenoxyethyl, benzyl, isobornyl, glycidyl, dicyclopentyl, morpholinoethyl, dimethylaminoethyl and straight-chain and branched C$_1$–C$_2$alkyl radicals, or if R$^5$ is a hydrogen atom, R$^6$, in addition to the radicals cited above, can also be a radical selected from the group consisting of pyrrolidon-2-yl, imidazonyl, carbazolyl, anthracenyl, phenyl, C$_5$-C$_8$cycloalkyl, naphthenyl, 2-norbornyl, pyridyl, N-caprolactamyl, formamidyl, acetamidyl and toluolyl.

2. A process for the production of three-dimensional objects from a formulation comprising at least one compound that contains free radically polymerisable groups, and at least one photoinitiator suitable for the polymerisation, which formulation additionally comprises a polyoxyalkylene-polysiloxane block copolymer which is selected from copolymers of the chemical formulae (I): R$^1$+OC$_c$H$_{2c}$)$_d$+[T]+(C$_c$H$_{2c}$O)$_{d-1}$+C$_c$H$_{2c}$)$_g$OR$^1$ (II):
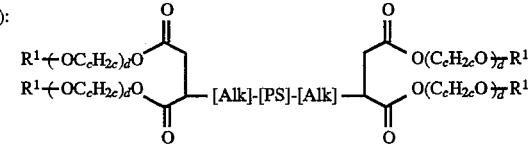

and (III)
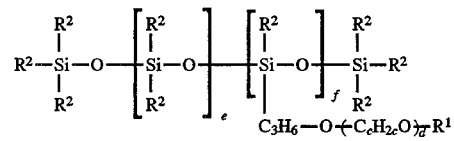

in which formulae the individual symbols have the following meanings:

R$^1$ is a member selected from hydrogen and C$_1$–C$_8$alkyl;
c is a number from 1 to 8 corresponding to the average number of carbon atoms of an akylene unit in a polyoxyalkylene group (C$_c$H$_{2c}$O)$_d$;
d is an integer from 1 to 100;
g is an integer from 1 to 4;
[T] is a group selected from the groups of formulae T1 to T12:

T1: 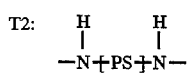

T2: 

T3: —O-[Alk]-[PS]-[Alk]-O—

T4: 

T5: 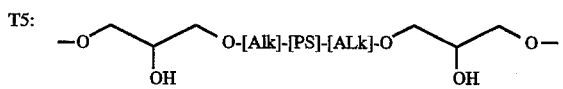

T6: 

T7: 

T8: 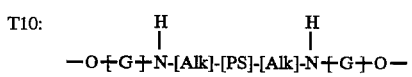

T9: —O─┤G├─O─┤PS├─O─┤G├─O—

T10: —O─┤G├─N-[Alk]-[PS]-[Alk]-N─┤G├─O—

T11: —O─┤G├─O-[Alk]-[PS]-[Alk]-O─┤G├─O—

T12: —O─┤G├─O─┤$C_mH_{2m}$O$)_n$-[Alk]-[PS]-[Alk]-(O$C_mH_{2m}$$)_n$─O─┤G├─O—

[PS] is a polysiloxane of formula

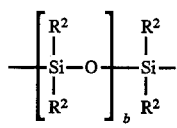

$R^2$ is a group selected from methyl and phenyl;
b is an integer from 1 to 100;
[Alk] is an alkylene group of 3 to 10 carbon atoms;
[Alk$^1$] is an alkylene group of 1 to 20 carbon atoms;
m is a number from 1 to 8 corresponding to the average number of carbon atoms of an alkylene unit in a polyoxyalkylene group $(C_mH_{2m}O)_n$;
n is an integer from 1 to 50;
[G] is a group of formula

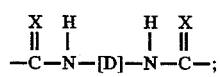

X is an atom selected from oxygen and sulfur;
[D] is a divalent hydrocarbon radical containing at least 2 carbon atoms;
e is an integer from 1 to 100, and
f is an integer from 1 to 50
by stereolithography, which comprises irradiating a layer of said formulation over the entire surface or in a predetermined pattern with actinic light from an ultraviolet/visible light source, such that within the irradiated areas a layer solidifies in a desired layer thickness, then a new layer of the formulation is formed on the solidified layer, which layer is likewise irradiated over the entire surface or in a predetermined pattern, and such that three-dimensional objects are formed from a plurality of solidified layers which adhere to one another by repeated coating and irradiation.

3. A process according to claim 2, wherein [D] is chosen from alkylene groups of 2 to 8 carbon atoms and divalent hydrocarbon radicals containing not more than 30, preferably not more than 20, carbon atoms, which last mentioned radicals contain at least one six-member-$C_1$-$C_4$alkyl substituent.

4. A process according to claim 3, wherein
$R^1$ is a member selected from hydrogen and $C_1$-$C_4$alkyl
$R^2$ is a methyl group;
[Alk] is a —$(CH_2)_3$— group;
[Alk$^1$] is an alkylene group containing 2 to 10, preferably 2 to 4 carbon atoms;
X is an oxygen atom;
[D] is a divalent hydrocarbon radical selected from radicals of the following formulae:

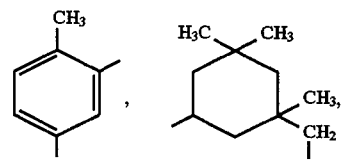

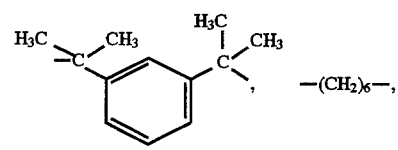

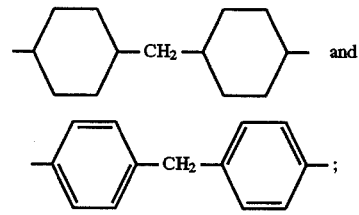

c is a number from 2 to 4;
d is an integer from 5 to 50;
b is an integer from 10 to 50;
m is a number from 2 to 4;
n is an integer from 5 to 20;
e is an integer from 1 to 50, and
f is an integer from 1 to 25.

5. A process according to claim 4, wherein
$R^1$ is a methyl group;
[Alk] and
[Alk$^1$] are each a —$(CH_2)_3$— group;
c is 2;
d if the formulation contains a block copolymer of formula (I) or (II), is an integer from 7 to 25 and, if the formulation contains a block copolymer of formula (III), is an integer from 2 to 20;
g is 1;
m is 2, and
n is an integer from 7 to 20.

6. A process according to claim 2, wherein polyoxyalkylene-polyoxysiloxane block copolymer is selected from copolymers of the chemical formulae (I) and (II) and wherein the compounds that contain free radically polymerisable groups are a mixture comprising the following components:
(i) a difunctional monomeric or polymeric acrylate or methacrylate;
(ii) a tri- or polyfunctional acrylate or methacrylate;
(iii) an unsaturated monomer of formula

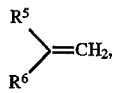 (IV)

wherein
$R^5$ is a member selected from hydrogen and methyl, and
$R^6$ is a radical of formula

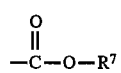 (V)

wherein
$R^7$ is a radical selected from the group consisting of tetrahydrofurfuryl, cyclohexyl, 2-phenoxyethyl, benzyl, isobornyl, glycidyl, dicyclopentyl, morpholinoethyl, dimethylaminoethyl and straight-chain and branched $C_1$–$C_2$alkyl radicals, or if $R^5$ is a hydrogen atom, $R^6$, in additional to the radicals cited above, can also be a radical selected from the group consisting of pyrrolidon-2-yl, imidazonyl, carbazolyl, anthacenyl, phenyl, $C_5$–$C_8$cycloalkyl, naphthenyl, 2-norbornyl, pyridyl, N-caprolactamyl, formamidyl, acetamidyl and toluolyl.

7. A process according to claim 6 comprising as component (i) at least one compound of formula

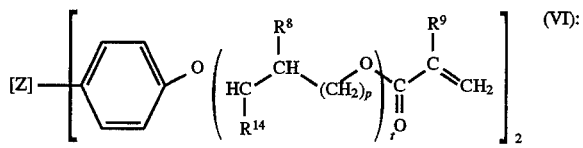 (VI):

wherein
p is 0 or 1, t is 0 or 1 or, if p is 0, is an integer from 1 to 3,
[Z] is —O—, —S—, —SO$_2$— or $C(R^{10})(R^{11})$—,
$R^{10}$ and
$R^{11}$ are each independently of the other a radical selected from hydrogen, —CF$_3$ and methyl,
$R^{14}$ if p is 0, is hydrogen or methyl, and, if p is 1, is hydrogen,
$R^8$ is p is 0, is hydrogen and if p is 1, is hydroxyl and
$R^9$ is hydrogen or methyl, as component (ii) a triacrylate or trimethacrylate of formula

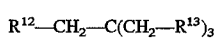 (VII)

wherein $R^{12}$ is methyl or a radical of formula

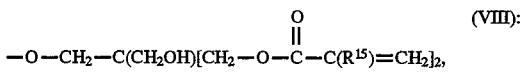 (VIII):

each $R^{15}$ is independently of the other hydrogen or methyl, and
$R^{13}$ is a radical of formula

 (IX):

8. A process according to claim 7, which comprises as component (i) at least two compounds of formula (VI) in which
[Z] in both compounds is a —C(CH$_3$)$_2$— group, and
p in the formula of one of the two compounds is 0 and in the other is 1,
and component (iii) is selected from 1-vinylpyrrolidone, phenoxyethylacrylate, phenoxyethylmethacrylate and a mixture of at least two of the components.

* * * * *